US012181160B2

(12) United States Patent
Dingman et al.

(10) Patent No.: US 12,181,160 B2
(45) Date of Patent: *Dec. 31, 2024

(54) OVEN WALL COMPOSITIONS AND/OR STRUCTURES

(71) Applicant: TPS IP, LLC, Cleveland, OH (US)

(72) Inventors: Lyle Oscar Dingman, East Troy, WI (US); Michael Abraham Schneck, New Berlin, PA (US); Gary Allen Hanson, Janesville, WI (US); David Allen Strand, Burlington, WI (US); Michael Laddie Grande, Elkhorn, WI (US); Geoffry Allen Gromiuk, Mukwonago, WI (US); Steven Edward Kempowski, Oconomowoc, WI (US); Jon Allen Ludlum, Darien, WI (US)

(73) Assignee: TPS IP, LLC, Cleveland, OH (US)

( * ) Notice: Subject to any disclaimer, the term of this patent is extended or adjusted under 35 U.S.C. 154(b) by 13 days.

This patent is subject to a terminal disclaimer.

(21) Appl. No.: 17/658,550

(22) Filed: Apr. 8, 2022

(65) Prior Publication Data
US 2022/0228752 A1 Jul. 21, 2022

Related U.S. Application Data

(62) Division of application No. 15/922,519, filed on Mar. 15, 2018, now Pat. No. 11,346,560.
(Continued)

(51) Int. Cl.
*F24C 7/08* (2006.01)
*F23M 5/00* (2006.01)
(Continued)

(52) U.S. Cl.
CPC ............... *F24C 7/08* (2013.01); *F23M 5/00* (2013.01); *F24C 7/06* (2013.01); *F24C 7/085* (2013.01);
(Continued)

(58) Field of Classification Search
CPC .. H05B 3/54; F23M 2900/05004; F23M 5/00; F24C 15/005; F24C 15/08;
(Continued)

(56) References Cited

U.S. PATENT DOCUMENTS 2,192,519 A 3/1940 King
2,836,498 A 5/1958 Fennema
(Continued)

FOREIGN PATENT DOCUMENTS

CN 201098013 Y 8/2008
CN 202348357 U 7/2012
(Continued)

OTHER PUBLICATIONS

CN 101986040 (Year: 2011).*
(Continued)

*Primary Examiner* — Vy T Nguyen
(74) *Attorney, Agent, or Firm* — Amin, Turocy & Watson, LLP

(57) ABSTRACT

Techniques regarding the composition and/or structure of oven walls are provided. For example, one or more embodiments described herein can comprise an oven with a heat source configured to heat a hollow space within the oven. The oven further can comprise an oven body that can define the hollow space. Also, the oven body can comprise a plurality of connected sides, wherein one or more of the connected sides comprise a plurality of carbon nanotubes.

13 Claims, 7 Drawing Sheets

Related U.S. Application Data

(60) Provisional application No. 62/611,799, filed on Dec. 29, 2017.

(51) Int. Cl.
*F24C 7/06* (2006.01)
*F24C 15/00* (2006.01)
*F24C 15/08* (2006.01)
*G01K 1/14* (2021.01)
*H05B 3/54* (2006.01)
*H10K 85/20* (2023.01)

(52) U.S. Cl.
CPC ............ *F24C 15/005* (2013.01); *F24C 15/08* (2013.01); *F23M 2900/05004* (2013.01); *G01K 1/14* (2013.01); *H05B 3/54* (2013.01); *H10K 85/221* (2023.02)

(58) Field of Classification Search
CPC ...... F24C 7/04; F24C 7/06; F24C 7/08; F24C 7/085; H01L 51/0048; G01K 1/14
USPC ....... 219/399, 400, 543, 553, 214, 390, 401, 219/408, 409, 413, 451.1, 465.1, 494, 219/541, 542, 681, 685, 702, 746, 756, 219/757, 762, 763; 99/401, 447, 329 P, 99/450, 483; 126/153, 41 R, 152 B, 126/152 R, 21 R, 25 R, 273 R, 275 R, 126/299 D, 299 R, 30, 307 A, 307 R, 312, 126/84, 85 B; 454/339, 359, 361, 367; 977/742, 842; 700/282
See application file for complete search history.

(56) References Cited

U.S. PATENT DOCUMENTS

| | | | |
|---|---|---|---|
| 3,127,889 | A | 4/1964 | Mills |
| 4,262,026 | A | 4/1981 | Korkmaz |
| 4,274,688 | A | 6/1981 | Zacky |
| RE31,529 | E | 3/1984 | Lowe |
| 4,509,553 | A | 4/1985 | Hahn |
| 4,512,362 | A | 4/1985 | Groeschner |
| 4,701,334 | A | 10/1987 | Durth |
| 4,708,069 | A | 11/1987 | Kidd |
| 4,712,578 | A | 12/1987 | White |
| 4,726,352 | A | 2/1988 | Radke |
| 4,726,399 | A | 2/1988 | Miller |
| 4,830,054 | A | 5/1989 | Feichtiger et al. |
| 4,913,189 | A | 4/1990 | Kline et al. |
| 5,107,897 | A | 4/1992 | Stoll |
| 5,121,513 | A | 6/1992 | Thomas et al. |
| 5,235,903 | A | 8/1993 | Tippmann |
| 5,355,868 | A | 10/1994 | Haen |
| 5,417,246 | A | 5/1995 | Perkins et al. |
| 5,657,786 | A | 8/1997 | DuRoss et al. |
| 5,927,337 | A | 7/1999 | LaMantia |
| 5,993,878 | A | 11/1999 | Tippmann |
| 6,247,773 | B1 | 6/2001 | Harigai et al. |
| 6,578,600 | B1 | 6/2003 | Young, Jr. |
| 6,713,741 | B2 | 3/2004 | Miller |
| 6,766,830 | B2 | 7/2004 | Rondreux et al. |
| 7,191,800 | B2 | 3/2007 | Berner et al. |
| 7,484,527 | B2 | 2/2009 | Tamaki et al. |
| 8,047,198 | B2 | 11/2011 | Meyer et al. |
| 8,082,943 | B2 | 12/2011 | Berner et al. |
| 8,172,546 | B2 | 5/2012 | Cedrone et al. |
| 8,753,097 | B2 | 6/2014 | Cedrone et al. |
| 8,807,164 | B2 | 8/2014 | Baier et al. |
| 9,732,876 | B2 | 8/2017 | Johnson |
| 10,008,037 | B1 | 6/2018 | Worley, III et al. |
| 9,921,641 | B1 | 8/2018 | Worley, III et al. |
| 10,495,374 | B1 | 12/2019 | Hall et al. |
| 10,504,384 | B1 | 12/2019 | Drake |
| 2002/0088244 | A1 | 7/2002 | Jennings et al. |
| 2002/0088800 | A1 | 7/2002 | Miller |
| 2003/0061773 | A1 | 4/2003 | O'Leary |
| 2004/0086606 | A1* | 5/2004 | Roehr ................. A47F 3/001 426/126 |
| 2004/0123857 | A1 | 7/2004 | Viraldo |
| 2006/0289530 | A1 | 12/2006 | Cordae |
| 2007/0095413 | A1 | 5/2007 | Zhu et al. |
| 2007/0267402 | A1 | 11/2007 | Harned et al. |
| 2008/0149088 | A1 | 6/2008 | Inada et al. |
| 2008/0206420 | A1 | 8/2008 | McFadden |
| 2009/0090347 | A1 | 4/2009 | Kim et al. |
| 2009/0194090 | A1 | 8/2009 | Kim et al. |
| 2009/0236333 | A1 | 9/2009 | Ben-Shmuel et al. |
| 2010/0128755 | A1 | 5/2010 | Uckhardt et al. |
| 2010/0242370 | A1 | 9/2010 | Trulaske, Sr. |
| 2010/0296996 | A1 | 11/2010 | Ohta et al. |
| 2011/0036826 | A1* | 2/2011 | Feng ..................... F24C 7/06 219/409 |
| 2011/0050872 | A1 | 3/2011 | Harbert et al. |
| 2011/0151076 | A1 | 6/2011 | Zapp Glauser |
| 2011/0266271 | A1 | 11/2011 | Boyer et al. |
| 2011/0283714 | A1* | 11/2011 | Veltrop ............... F25D 23/003 165/104.19 |
| 2011/0318698 | A1 | 12/2011 | Gaur et al. |
| 2013/0092032 | A1 | 4/2013 | Cafferty et al. |
| 2014/0026762 | A1 | 1/2014 | Riefenstein |
| 2014/0097172 | A1 | 4/2014 | Kang et al. |
| 2014/0203012 | A1 | 7/2014 | Corona et al. |
| 2015/0019017 | A1 | 1/2015 | Bodine et al. |
| 2015/0118632 | A1 | 4/2015 | Liu |
| 2015/0182074 | A1 | 7/2015 | Bucher et al. |
| 2015/0201803 | A1* | 7/2015 | Veltrop ................ F25B 21/02 62/3.2 |
| 2016/0140728 | A1 | 5/2016 | Aonuma et al. |
| 2016/0160880 | A1 | 6/2016 | Douglas et al. |
| 2016/0187001 | A1* | 6/2016 | Bombardieri ......... F24C 7/067 219/390 |
| 2016/0327281 | A1 | 11/2016 | Bhogal et al. |
| 2016/0345167 | A1 | 11/2016 | Li et al. |
| 2016/0356388 | A1 | 12/2016 | Inoue |
| 2016/0374501 | A1 | 12/2016 | Logan et al. |
| 2017/0205108 | A1 | 7/2017 | Petrovic et al. |
| 2017/0208652 | A1 | 7/2017 | Luckhardt et al. |
| 2017/0243515 | A1 | 8/2017 | Vengroff et al. |
| 2018/0032125 | A1 | 2/2018 | Peterson et al. |
| 2018/0062691 | A1 | 3/2018 | Barnett, Jr. |
| 2018/0073255 | A1 | 3/2018 | Jeffries |
| 2018/0100656 | A1* | 4/2018 | Deshpande ............ F24C 7/062 |
| 2018/0101608 | A1 | 4/2018 | Thysell |
| 2018/0114372 | A1 | 4/2018 | Nagy et al. |
| 2018/0163971 | A1 | 6/2018 | Mizusaki et al. |
| 2018/0181094 | A1 | 6/2018 | Funk et al. |
| 2018/0220500 | A1 | 8/2018 | Staton et al. |
| 2018/0345485 | A1 | 12/2018 | Sinnet et al. |
| 2019/0062084 | A1 | 2/2019 | Delieutraz et al. |
| 2019/0066239 | A1 | 2/2019 | Touchette et al. |
| 2019/0121522 | A1 | 4/2019 | Davis et al. |
| 2019/0159300 | A1 | 5/2019 | Khizar et al. |
| 2019/0295330 | A1 | 9/2019 | Nagy et al. |
| 2019/0374059 | A1* | 12/2019 | Samonigg ............... A47J 37/06 |
| 2020/0005669 | A1 | 1/2020 | Thysell |

FOREIGN PATENT DOCUMENTS

| | | |
|---|---|---|
| CN | 202810961 U | 3/2013 |
| CN | 103148472 A | 6/2013 |
| DE | 10 2006 029 902 A1 | 1/2008 |
| GB | 996233 A | 10/1963 |
| WO | 2013/171181 A1 | 11/2013 |
| WO | 2021/095395 A1 | 5/2021 |

OTHER PUBLICATIONS

Shei, CN 102893091 (Year: 2013).*
U.S. Appl. No. 15/922,519, filed Mar. 15, 2018.
Non-Final Office Action received for U.S. Appl. No. 15/922,445 dated Jun. 23, 2022, 37 pages.

(56) References Cited

OTHER PUBLICATIONS

Advisory Action received for U.S. Appl. No. 15/922,445 dated Jun. 10, 2022, 29 pages.
Notice of Allowance received for U.S. Appl. No. 15/922,445 dated Oct. 18, 2022, 48 pages.
Notice of Allowance received for U.S. Appl. No. 17/931,346 dated Dec. 6, 2023, 54 pages.
Notice of Allowance received for U.S. Appl. No. 17/931,328 dated Nov. 29, 2023, 62 pages.
Non-Final Office Action received for U.S. Appl. No. 17/658,543 dated Feb. 1, 2024, 107 pages.
Non-Final Office Action received for U.S. Appl. No. 15/922,623 dated Jul. 25, 2019, 31 pages.
Final Office Action received for U.S. Appl. No. 15/922,623 dated Dec. 16, 2019, 24 pages.
Non-Final Office Action received for U.S. Appl. No. 15/922,584 dated Mar. 2, 2020, 43 pages.
Non-Final Office Action received for U.S. Appl. No. 15/922,605 dated Apr. 3, 2020, 53 pages.
Non-Final Office Action received for U.S. Appl. No. 15/922,445 dated May 29, 2020, 45 pages.
Non-Final Office Action received for U.S. Appl. No. 15/922,569 dated Jun. 8, 2020, 36 pages.
Final Office Action received for U.S. Appl. No. 15/922,519 dated Jun. 8, 2020, 37 pages.
Notice of Allowance received for U.S. Appl. No. 15/922,584 dated Jun. 10, 2020, 50 pages.
Final Office Action received for U.S. Appl. No. 15/922,445 dated Dec. 11, 2020, 45 pages.
Final Office Action received for U.S. Appl. No. 15/922,605 dated Oct. 26, 2020, 24 pages.
Final Office Action received for U.S. Appl. No. 15/922,519 dated Nov. 30, 2020, 33 pages.
Final Office Action received for U.S. Appl. No. 15/922,569 dated Oct. 6, 2020, 34 pages.
Advisory Office Action received for U.S. Appl. No. 15/922,605 dated Jan. 25, 2021, 16 pages.
Non-Final Office Action received for U.S. Appl. No. 15/922,605 dated Feb. 19, 2021, 31 pages.
Advisory Office Action received for U.S. Appl. No. 15/922,519 dated Feb. 19, 2021, 12 pages.
Non-Final Office Action received for U.S. Appl. No. 15/922,445 dated Aug. 19, 2021, 49 pages.
Final Office Action received for U.S. Appl. No. 15/922,605 dated Aug. 18, 2021, 35 pages.
Non-Final Office Action received for U.S. Appl. No. 15/922,519 dated Aug. 6, 2021, 49 pages.
Non-Final Office Action received for U.S. Appl. No. 15/922,569 dated Jul. 23, 2021, 54 pages.
Non-Final Office Action received for U.S. Appl. No. 15/922,605 dated Jan. 13, 2022, 42 pages.
Notice of Allowance received for U.S. Appl. No. 15/922,519 dated Jan. 10, 2022, 57 pages.
Notice of Allowance received for U.S. Appl. No. 15/922,569 dated Dec. 1, 2021, 51 pages.
Advisory Office Action received for U.S. Appl. No. 15/922,605 dated Dec. 20, 2021, 22 pages.
Final Office Action received for U.S. Appl. No. 15/922,445 dated Mar. 15, 2022, 51 pages.
Non-Final Office Action received for U.S. Appl. No. 17/931,346 dated Mar. 2, 2023, 72 pages.
Non-Final Office Action received for U.S. Appl. No. 17/931,328 dated Feb. 17, 2023, 63 pages.
Final Office Action received for U.S. Appl. No. 17/931,346 dated Sep. 21, 2023, 89 pages.
Final Office Action received for U.S. Appl. No. 17/931,328 dated Sep. 8, 2023, 83 pages.
Notice of Allowance received for U.S. Appl. No. 15/922,605 dated Oct. 13, 2022, 6 pages.
Notice of Allowance received for U.S. Appl. No. 17/931,328 dated Mar. 13, 2024, 6 pages.
Notice of Allowance received for U.S. Appl. No. 17/931,346 dated Mar. 6, 2024, 6 pages.
Notice of Allowance received for U.S. Appl. No. 17/677,632 dated Mar. 4, 2024, 105 pages.
Final Office Action received for U.S. Appl. No. 17/658,543 dated Jun. 21, 2024, 118 pages.
Notice of Allowance received for U.S. Appl. No. 17/658,543 dated Sep. 13, 2024, 156 pages.
Notice of Allowance received for U.S. Appl. No. 17/677,632 dated May 20, 2024, 7 pages.
Notice of Allowance received for U.S. Appl. No. 17/658,543 dated Sep. 27, 2024, 6 pages.
Notice of Allowance received for U.S. Appl. No. 17/677,652 dated Oct. 7, 2024, 99 pages.

\* cited by examiner

OVEN WALL COMPOSITIONS AND/OR STRUCTURES

CROSS-REFERENCE TO RELATED APPLICATIONS

This application claims priority to U.S. Provisional Patent Application Ser. No. 62/611,799 filed on Dec. 29, 2017, entitled "OVEN WALL COMPOSITIONS AND/OR STRUCTURES" and U.S. patent application Ser. No. 15/922,519 filed on Mar. 15, 2018, entitled "OVEN WALL COMPOSITIONS AND/OR STRUCTURES". The entirety of the aforementioned application is incorporated by reference herein.

TECHNICAL FIELD

The subject disclosure relates to an oven with unique wall structures, and more specifically, to an oven with one or walls comprising light weight materials and/or housing one or more sensors.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems and/or apparatuses that can facilitate oven efficiency and/or sensing capacities are provided.

According to an embodiment, an oven is provided. The oven comprising a heat source configured to heat a hollow space within the oven. The oven further comprising an oven body that defines the hollow space, the oven body comprising a plurality of connected sides, wherein one or more of the connected sides comprise a plurality of carbon nanotubes.

According to another embodiment, an oven is provided. The oven comprising a heat source configured to heat a hollow space within the oven. The oven further comprising an oven body that can define the hollow space and house a plurality of sensors. A first sensor of the plurality of sensors can be configured to monitor an environment of the hollow space. Also, a second sensor of the plurality of sensors can be configured to monitor an object located within the hollow space.

According to another embodiment, an oven system is provided. The oven system can comprise a processor, operably coupled to a memory, and that can execute the computer executable components stored in the memory. The oven system can also comprise an oven body that can define a baking area. The oven body can comprise a plurality of walls, and the plurality of walls can comprise a plurality of carbon nanotubes and a sensor. The sensor can be operatively coupled to the processor.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1:
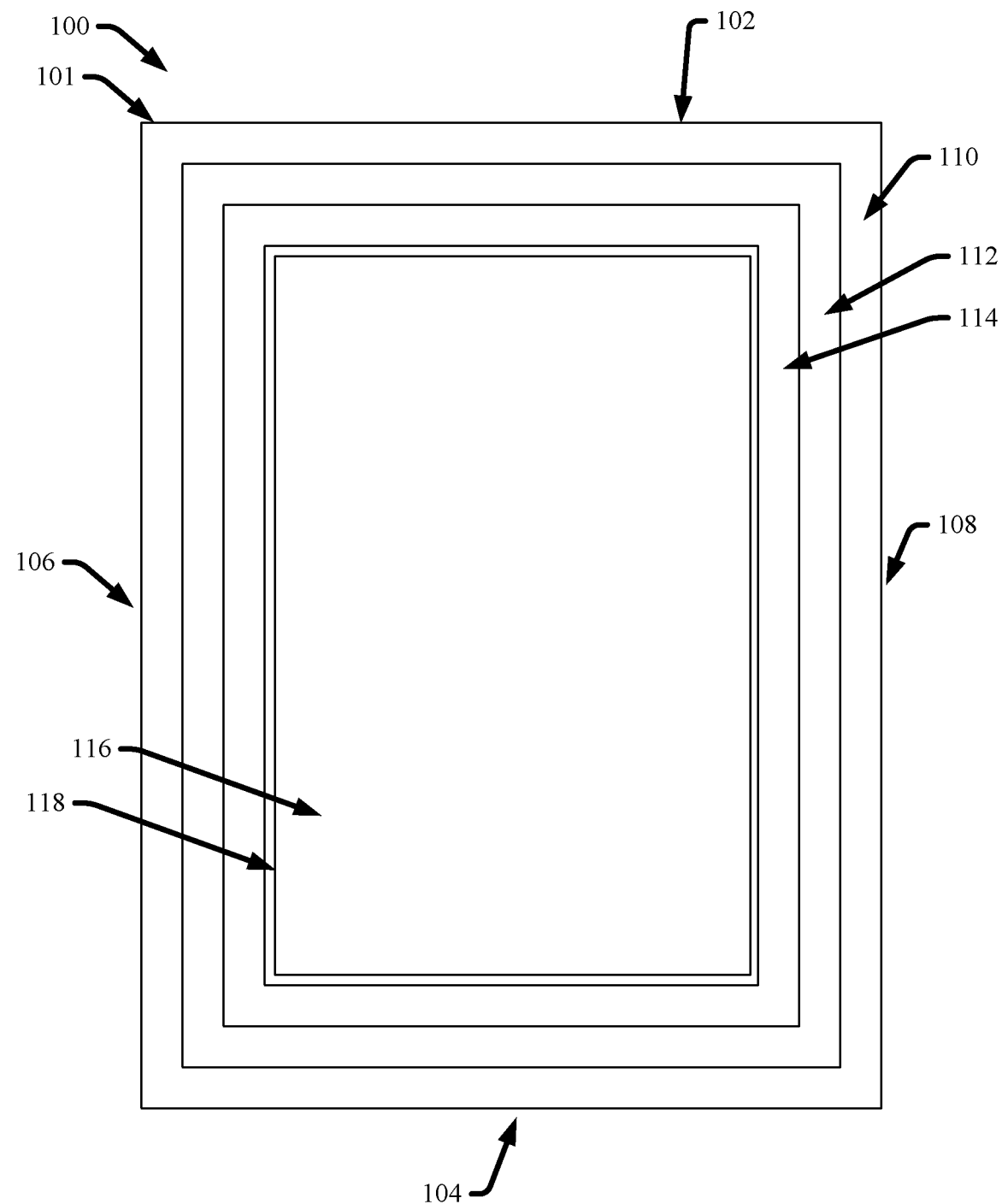
FIG. 1 illustrates a diagram of an example, non-limiting cross-section of an oven comprising a plurality of wall layers in accordance with one or more embodiments described herein.

FIG. 1 illustrates a diagram of an example, non-limiting cross-section of an oven 100 in accordance with one or more embodiments described herein. While FIG. 1 illustrates a two-dimensional diagram, the oven 100 can be a three-dimensional object, wherein the illustrated cross-sectional view can regard a cross-section of the oven 100 from a depth perspective or a width perspective. For example, the cross-sectional view of FIG. 1 can regard a perspective in which the front and/or back of the oven 100 is cut away. In another example, the cross-sectional view of FIG. 1 can regard a perspective in which a side of the oven 100 is cut away.

The oven 100 can comprise an oven body 101 having a top side 102, a bottom side 104, a left side 106, and/or a right side 108. Each of the top side 102, the bottom side 104, the left side 106, and/or the right side 108 can comprise a plurality of wall layers. For example, FIG. 1 illustrates the oven body 101 comprising three wall layers: an outer wall layer 110, an intermediate wall layer 112, and/or an inner wall layer 114. While FIG. 1 illustrates three wall layers, fewer or additional wall layers are also envisaged. For instance, the oven body 101 can comprise additional intermediate wall layers 112.

In one or more embodiments, each of the top side 102, the bottom side 104, the left side 106, and/or the right side 108 can comprise the same number of wall layers (e.g., as shown in FIG. 1). In various embodiments, the oven body 101 can comprise a first side with a different number of wall layers than a second side. For example, the top side 102 can comprise two wall layers while the right side 108 comprises three wall layers.

Similarly, in one or more embodiments each of the top side 102, the bottom side 104, the left side 106, and/or the right side 108 can comprise wall layers of the same material and/or structure. In various embodiments, the oven body 101 can comprise a first side having one or more wall layers made of a different material and/or structure than a second side. For example, the top side 102 can an inner wall layer 114 made of a first material and the right side 108 can comprise an inner wall layer 114 made of a second material.

The outer wall layer 110 can comprise a wall layer of the oven body 101 (e.g., the top side 102, the bottom side 104, the left side 106, and/or the right side 108) that is furthest from a baking area 116 of the oven 100 with respect to the other wall layers of a subject side of the oven body 101. The outer wall layer 110 can comprise the same material and/or have one or more common physical properties throughout the oven body 101. Alternatively, the outer wall layer 110 can a first material at a side of the oven body 101 and a second material at another side of the oven body 101. Thus, in various embodiments the outer wall layer 110 can have one or more varying physical properties throughout the oven body 101.

The baking area 116 can be a hollow space defined by the oven body 101 wherein one or more objects can be placed in order to be subject to baking by the oven 100. The baking area 116 can be heated by one or more heat sources (not shown). Also, the one or more heat sources can be within the baking area 116 and/or within the oven body 101. One of ordinary skill in the art will recognize the multitude of heat source configurations that can accommodated by the oven body 101.

Additionally, the intermediate wall layer 112 can comprise a wall layer of the oven body 101 (e.g., the top side 102, the bottom side 104, the left side 106, and/or the right side 108) located between the outer wall layer 110 and the inner wall layer 114. The intermediate wall layer 112 can comprise the same material and/or have one or more common physical properties throughout the oven body 101. Alternatively, the intermediate wall layer 112 can a first material at a side of the oven body 101 and a second material at another side of the oven body 101. Thus, in various embodiments the intermediate wall layer 112 can have one or more varying physical properties throughout the oven body 101. Further, the number of intermediate wall layers 112 that can comprise a subject side of the oven body 101 can remain constant and/or vary from one side to another side. Further, in various embodiments, one or more intermediate wall layers 112 can comprise a fluid gap (e.g., an air gap) between the outer wall layer 110 and the inner wall layer 114.

Moreover, the inner wall layer 114 can comprise a wall layer of the oven body 101 (e.g., the top side 102, the bottom side 104, the left side 106, and/or the right side 108) that is closest to the baking area 116 of the oven 100 with respect to the other wall layers of a subject side of the oven body 101. The inner wall layer 114 can comprise the same material and/or have one or more common physical properties throughout the oven body 101. Alternatively, the inner wall layer 114 can a first material at a side of the oven body 101 and a second material at another side of the oven body 101. Thus, in various embodiments the inner wall layer 114 can have one or more varying physical properties throughout the oven body 101.

One or more of the wall layers (e.g., the outer wall layer 110, the intermediate wall layer 112, and/or the inner wall layer 114) can comprise: iron, an iron composite, steal, a steal composite, one or more plastics (e.g., one or more polycarbonates), one or more ceramics, aluminum, an aluminum composite, nickel, a nickel composite, brick, stone, cement, copper, a copper composite, nano-carbons materials (e.g., carbon nanotubes and/or phenolic-impregnated carbon ablator (PICA) technology), rubber, glass, a combination thereof and/or the like.

In one or more embodiments, one or more of the wall layers (e.g., the outer wall layer 110, the intermediate wall layer 112, and/or the inner wall layer 114) can comprise nano-carbon technology. For example, one or more of the wall layers can comprise carbon nanotubes. The carbon nanotubes can be single walled nanotubes and/or multi-walled nanotubes. The carbon nanotubes can be utilized as an additive in one or more materials to form one or more of the wall layers. For example, carbon nanotubes can be used as an additive to ceramic, plastic, and/or glass materials in order increase the strength and/or shatter resistance of said materials. Thus, carbon nanotubes can be utilized to provide strength to light weight materials so as to reduce the weight of the oven body 101. Carbon nanotube additives can be grown on and/or within one or more materials of the wall layers with the assistance of a catalyst deposited on the subject material. The carbon nanotubes can be grown in one or more patterns and/or orientations based at least in part on the depositing of the catalyst. Additionally, carbon nanotube additives can be formed via a chemical vapor deposition (CVD) system comprising a hydrocarbon compound and a catalyst-bearing compound. Thus, carbon nanotube additives can also be added to a material without pattern. One of ordinary skill in the art will recognize the variety of methods that can be utilized to grow carbon nanotube additives in accordance with known techniques in the art.

For example, the inner wall layer 114 of one or more sides of the oven body 101 can comprise carbon nanotube additives, thereby increases the strength of the inner wall layer 114 while maintaining a lower weight than would otherwise be achieved. In another example, the outer wall layer 110 of one or more sides of the oven body 101 can comprise carbon nanotube additives, thereby increases the strength of the outer wall layer 110 while maintaining a lower weight than would otherwise be achieved. In a further example, one or more intermediate wall layers 114 can comprise carbon nanotube additives, thereby increases the strength of the respective intermediate wall layer 112 while maintaining a lower weight than would otherwise be achieved.

Additionally, carbon nanotubes can comprise a portion of a subject wall layer, rather than the entirety of said subject wall layer. For example, while a subject wall layer can be comprised of a first material (e.g., a plastic, ceramic, and/or glass), portions of said first material can be enhanced with carbon nanotube additives. For instance, areas of the subject wall layer that are subject to higher stresses (e.g., physical loads and/or temperature changes) than other areas of the subject wall layer can be reinforced with carbon nanotubes.

Moreover, carbon nanotube additives can be oriented vertically and/or horizontally throughout a subject wall layer to achieve desired thermal distribution throughout the oven body 101. Carbon nanotubes can be more thermally conductive along their length than along their width. Therefore, carbon nanotube additives comprising one or more of the wall layers (e.g., the outer wall layer 110, the one or more intermediate wall layers 112, and/or the inner wall layer 114) can be oriented so as to facilitate the direction of thermal conductivity within the oven body 101. For example, carbon nanotube additives can traverse the length of a subject wall layer in order to thermal conduct heat along the subject wall layer, and/or carbon nanotube additives can traverse the width of a subject wall layer to facilitate thermal conductivity through the subject wall layer.

For example, the inner wall layer 114 of one or more sides (e.g., the top side 102, the bottom side 104, the left side 106, and/or the right side 108) can comprise carbon nanotube additives oriented so as to direct thermal conductivity throughout the baking area 116. For instance, carbon nanotube additives comprising the inner wall layer 114 of the left side 106 and/or the right side 108 can be oriented vertically so as to thermally conduct heat towards the top side 102 and/or the bottom side 104; and carbon nanotube additives comprising the inner wall layer 114 of the top side 102 and/or the bottom side 104 can be oriented horizontally so as to thermally conduct heat towards the left side 106 and/or the right side 108.

In addition, one or more wall layers can comprise carbon nanotube additives oriented in a variety of directions within the same wall layer in order facilitate and/or inhibit thermal conductivity of the subject wall layer. For example, a wall layer (e.g., outer wall layer 110) can comprise carbon nanotubes oriented in a variety of contradictory directions so as to inhibit thermal conductivity through said wall layer. By changing the carbon nanotube orientation throughout the wall layer, the distribution of thermal energy through the wall layer can be inhibited. For instance, the outer wall layer 110 comprising one or more of the sides (e.g., the top side 102, the bottom side 104, the left side 106, and/or the right side 108) can comprise vertically oriented carbon nanotube additives adjacent to horizontally oriented carbon nanotube additives, wherein the difference in orientation can impede thermal conductivity between the carbon nanotubes. Impeding thermal conductivity can be an advantageous property of one or more wall layers (e.g., the outer wall layer 110) that may be subject to interaction with a user of the oven 100 in order to reduce potential harm to the user.

In various embodiments, the oven body 101 can further comprise a coating 118. The coating 118 can have a high or low emissivity depending on the desired function of the coating 118 and/or the location of the oven's 100 heat source (not shown). For example, wherein the heat source is located outside the baking area 116 (e.g., within and/or in between one or more of the wall layers), the coating 118 can have a high emissivity to facilitate the storing and/or releasing of heat. The coating 118 can be located on the inner wall layer 114 nearest the baking area 116 (e.g., as shown in FIG. 1). The coating 118 can comprise, for example: ceramic, clay, chrome, gypsum, iron (e.g., iron oxide), silicone carbide (e.g., carborundum), a plastic (e.g., a polycarbonate), a combination thereof, and/or the like. Additionally, the coating 118 can facilitate protecting the inner wall layer 114 from damage that may be inflicted by a product being backing within the baking area 116.

The coating 118 can be depositing on the oven 100 (e.g., the inner wall layer 114) via a variety of means, including, but not limited to: painting, spraying, spin-coating, CVD, dipping, a combination thereof, and/or the like. Furthermore, the coating 118 can enhance the inner wall layer's 114 endurance against substantial temperature changes.

Figure 2:
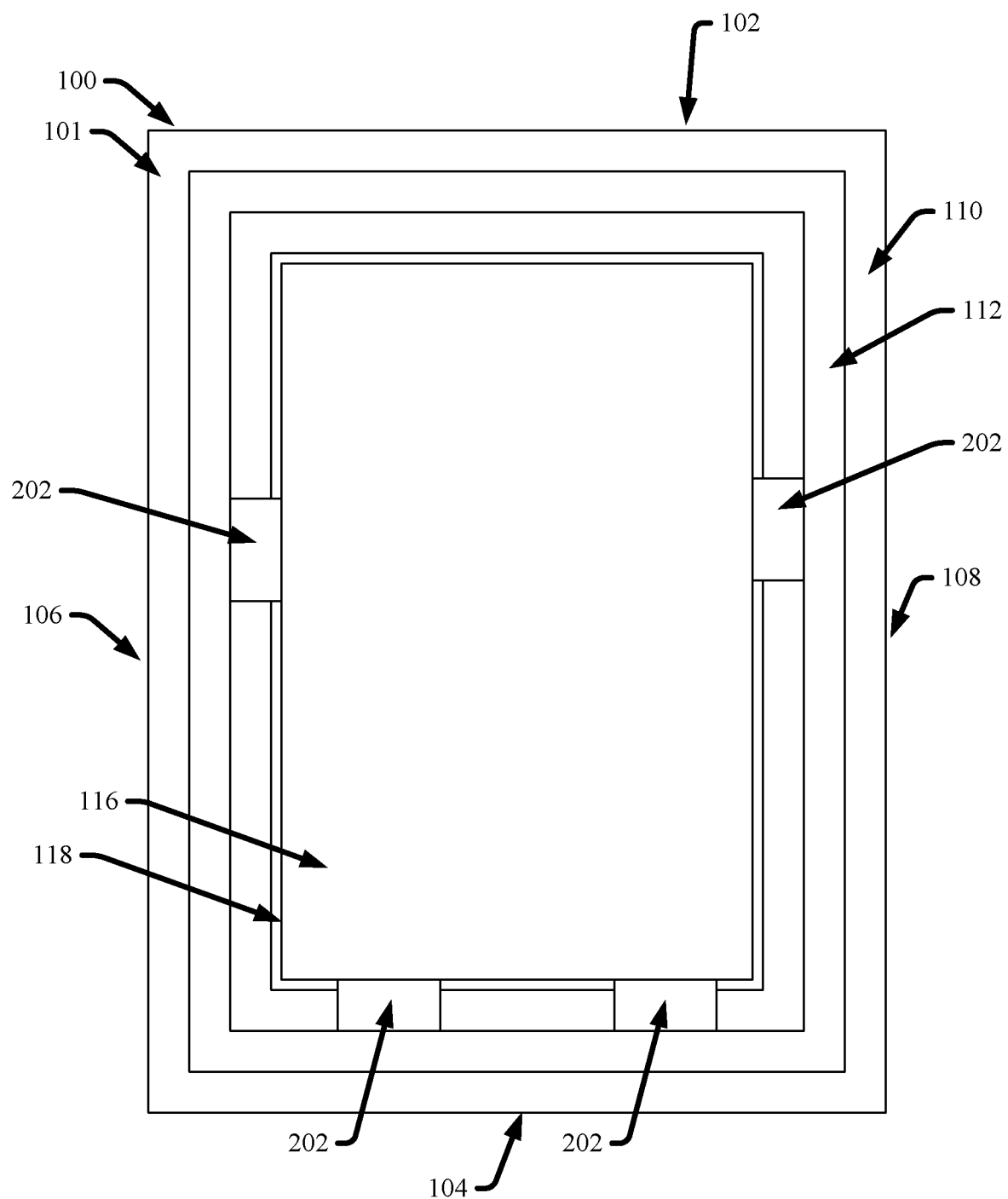
FIG. 2 illustrates a diagram of an example, non-limiting cross-section of an oven comprising a plurality of wall layers that can house one or more sensors in accordance with one or more embodiments described herein.

FIG. 2 illustrates a diagram of the example, non-limiting oven 100 comprising one or more sensors 202 in accordance with one or more embodiments described herein. Repetitive description of like elements employed in other embodiments described herein is omitted for sake of brevity. The one or more sensors 202 can enable a user of the oven 100 to monitor the conditions of the oven 100 and/or a product subject to baking within the oven 100 without interrupting the baking process and/or exposing the user to environmental conditions within the oven 100.

To facilitate monitoring the environmental conditions of the baking area 116 and/or a product within the baking area 116, the oven 100 can comprise one or more sensors 202 located within the oven body 101. Example sensors can include, but are not limited to: temperature sensors, such as mechanical temperatures sensors (e.g., thermometers and/or laser thermometers) and/or electrical temperature sensors (e.g., thermistor, thermocouples, and/or resistance temperature detectors), cameras (e.g., thermal imaging cameras, digital cameras, still image cameras, and/or motion cameras), pressure sensors (e.g., scales, pressure transducers, pressure switches, barometers, analog pressure sensors (e.g., force collector types), digital pressure sensors, and/or thermal pressure sensors), lasers, hydrometers, air quality meters (e.g., devices to detect pollutants in an environment, such as carbon dioxide levels, volatile organic compound levels, carbon monoxide levels, and/or the like) a combination thereof, and/or the like.

The one or more sensors 202 can monitor environmental conditions of the baking area 116 such as, but not limited to: temperature, pressure, humidity, air quality, a combination thereof, and/or the like. For example, one or more sensors 202 can comprise a pressure sensors that can measure the atmospheric pressure of the baking area 116 during a baking processes. In another example, the one or more sensors 202 can comprise an air quality meter that can detect the presence of one or more pollutants in the environment of the baking area 116, which may form as a result of baking a subject product.

Further, the one or more sensors 202 can monitor one or more properties (e.g., physical properties) of a product within the baking area 116 such as, but not limited to: weight of a subject product, size of subject product, temperature of a subject product, density of a subject product, hardness of a subject product, a combination thereof, and/or the like. For example, one or more of the sensors 202 can comprise one or more pressure sensors can measure the weight of a product placed upon the sensors 202. In another example, one or more of the sensors 202 can comprise thermal imaging cameras that can illustrate heat distribution throughout the subject product as the product is subject to baking within the baking area 116.

FIG. 2 illustrates the one or more sensors 202 located in the inner wall layer 114; however, the one or more sensors 202 can also extend to other wall layers of the oven body 101. Additionally, the one or more sensors 202 can be located in the intermediate wall layers 112 and/or the outer wall layer 110 without being located in the inner wall layer 114. For example, one or more pressure sensors can be located in one or more intermediate wall layers 112 and can be triggered by deformation of the inner wall layer 114.

Further, while FIG. 2 illustrates four sensors 202, the oven body 101 can comprise additional or fewer sensors 202. Further, although in the embodiment shown the one or more sensors 202 can comprise four sensors 202 (e.g., one sensor 202 located in the left side 106, one sensor 202 located in the right side 108, and two sensors located in the bottom side 104), it should be appreciated that the architecture of the oven body 101 is not so limited. The one or more sensors 202 can be located at various positions along any side (e.g., the top side 102, the bottom side 104, the left side 106, and/or the right side 108) of the oven body 101. Further, each side of the oven body 101 can comprise a single sensor 202 and/or a plurality of sensors 202. Additionally, different types of the one or more sensors 202 can be located at different positions throughout the oven body 101 depending on the function of the sensors 202. For example, one or more pressure sensors can be located in the bottom side 104, while one or more thermal sensors and/or lasers can be located in the left side 106 and/or right side 108, and one or more cameras can be located in the top side 102. In another example, each side of the oven body 101 can comprise one or more of the same sensors 202.

Moreover, the one or more sensors 202 can be coupled to one or more processors (e.g., a central processing unit (CPU)) to facilitate collection and/or dissemination of the data collected by the one or more sensors 202. The one or more sensors can be coupled to the one or more processors (not shown) through a wired connection and/or a wireless connection. For example, the one or more sensors 202 can be connected to one or more networks. The one or more networks can comprise wired and wireless networks, including, but not limited to, a cellular network, a wide area network (WAN) (e.g., the Internet) or a local area network (LAN). For example, the one or more sensors 202 can communicate with the one or more processors (and vice versa) using virtually any desired wired or wireless technology including for example, but not limited to: cellular, WAN, wireless fidelity (Wi-Fi), Wi-Max, WLAN, Bluetooth technology, cloud technology, a combination thereof, and/or the like.

Figure 3:
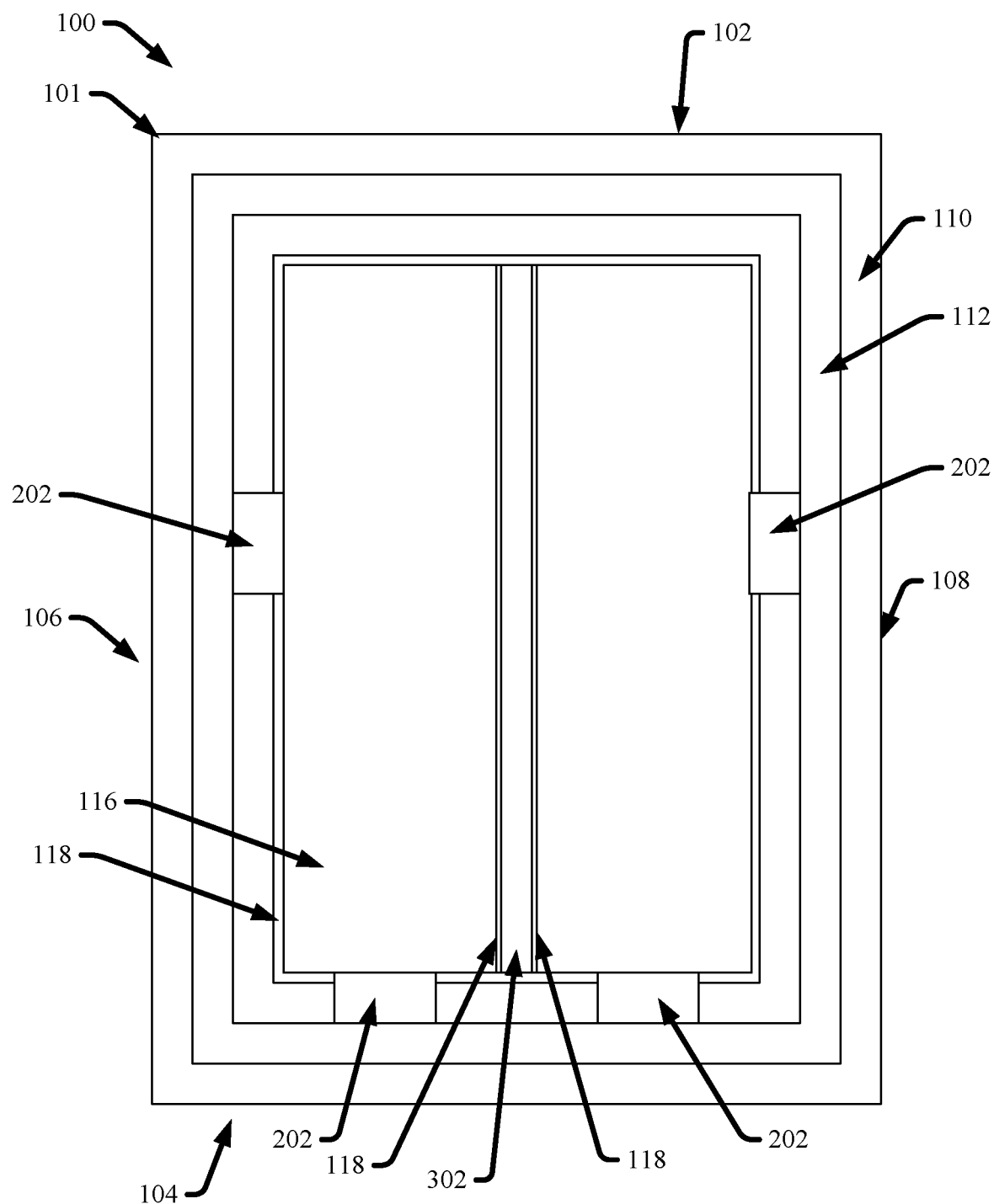
FIG. 3 illustrates a diagram of an example, non-limiting cross-section of an oven comprising one or more removable oven wall dividers in accordance with one or more embodiments described herein.

FIG. 3 illustrates a diagram of the example, non-limiting oven 100 further comprising one or more dividers 303. Repetitive description of like elements employed in other embodiments described herein is omitted for sake of brevity. The one or more dividers 302 can segregate portions of the of the baking area 116. The baking area 116 can be segregated to facilitate execution of different environmental conditions throughout the baking area 116 and/or to maintain separation between a plurality of products within the baking area 116.

The divider 302 can comprise the same material as any of the wall layers. For example, the divider 302 can comprise iron, an iron composite, steal, a steal composite, one or more plastics (e.g., one or more polycarbonates), one or more ceramics, aluminum, an aluminum composite, nickel, a nickel composite, brick, stone, cement, copper, a copper composite, nano-carbons materials (e.g., carbon nanotubes and/or phenolic-impregnated carbon ablator (PICA) technology), rubber, glass, a combination thereof and/or the like. In one or more embodiments, the one or more dividers 302 can comprise carbon nanotube additives as described herein with regard to the wall layers.

Additionally, the one or more dividers 302 can be removable from the oven body 101. For example, the one or more dividers 302 can attach and/or detach with the inner wall layer 114 of the oven body 101. For example, the one or more dividers 302 can slide into grooves and/or slots located in the inner wall layer 114 (e.g., on any of the sides of the oven body 101). In another example, the one or more dividers 302 can be fastened to the inner wall layer 114.

Further, although FIG. 3 illustrates a single divider 302 oriented in a vertical direction, it should be appreciated that the architecture of the oven 100 is not so limited. The oven 100 can comprise a plurality of dividers 302. Also, the one or more dividers 302 can be oriented in a vertical fashion (e.g., extending from the top side 102 to the bottom side 104) and/or a horizontal fashion (e.g., extending from the left side 106 to the right side 108).

Moreover, the one or more dividers 302 can covered with the coating 118. As shown in FIG. 3, both sides of the one or more dividers 302 can comprise the coating 118. Alternatively, one side of the dividers 302 can comprise the coating 118 while another side of the divider 302 can be absent of the coating 118. Additionally, one side of the one or more dividers 302 can comprise a first embodiment of the coating 118 (e.g., an embodiment comprising ceramic) while a second side of the one or more dividers can comprise a second embodiment of the coating 118 (e.g., another embodiment comprising a plastic). Altering the type of coating 118 on each side of the one or more dividers 302 can facilitate execution of alternate baking conditions in the separate regions formed within the baking area 116 by the one or more dividers 302. Furthermore, the one or more dividers 302 can comprise the same embodiment of coating 118 as the embodiment of coating 118 comprising the inner wall layer 114 or a different embodiment of coating 118 as the embodiment of coating 118 comprising the inner wall layer 114.

Figure 4:
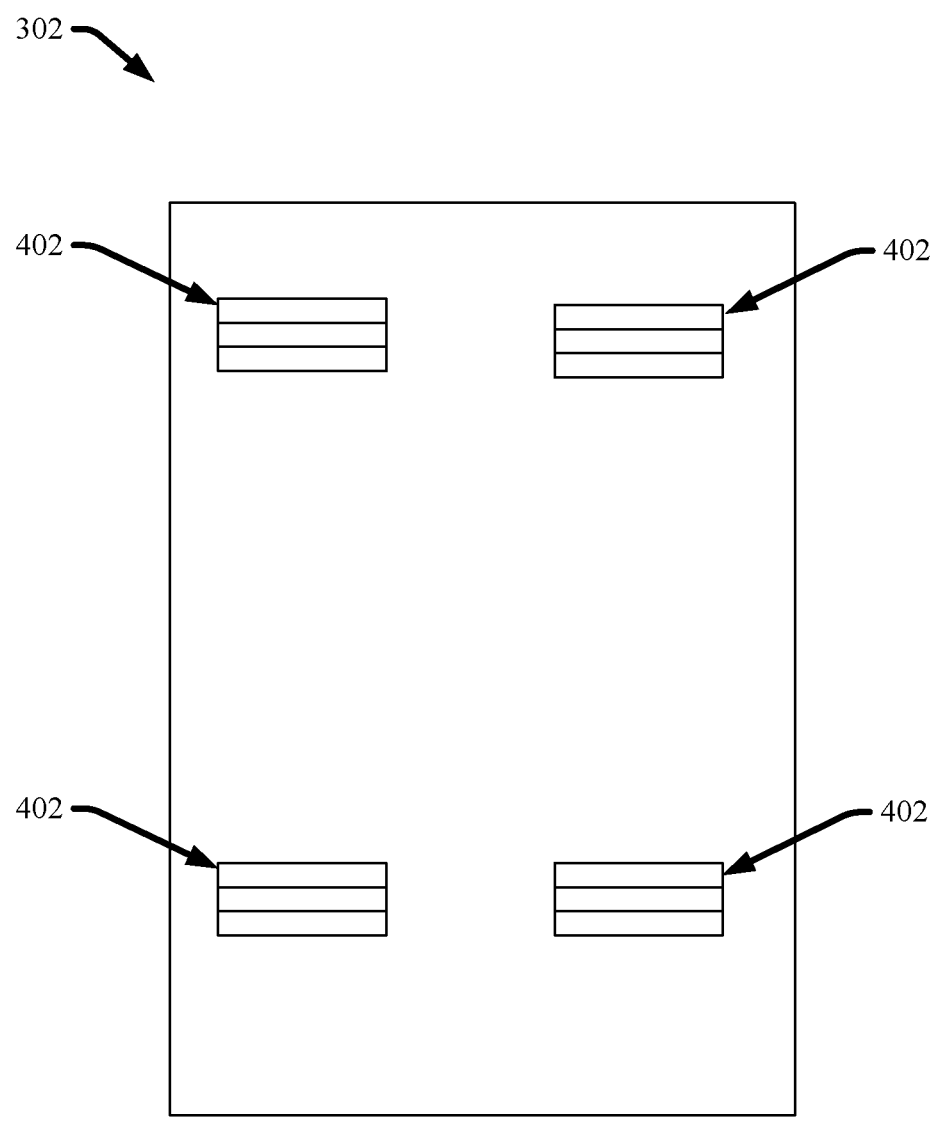
FIG. 4 illustrates a diagram of an example, non-limiting oven wall divider in accordance with one or more embodiments described herein.

FIG. 4 illustrates a diagram of an example, non-limiting divider 302 that can comprise one or more vents 402 in accordance with one or more embodiments described herein. Repetitive description of like elements employed in other embodiments described herein is omitted for sake of brevity. The one or more vents 402 can facilitate manipulation of the atmosphere in the baking area 116.

The one or more vents 402 can be configured to an open or closed position, thereby permitting or inhibiting atmosphere from traversing from one region of the baking area 116 to another region of the baking area 116. In one or more embodiments, the one or more vents 402 can be opened and/or closed manually. In various embodiments, the one or more vents 402 can be opened and/or closed remotely. For example, the one or more vents 402 can be coupled to one or more actuators. Further, the one or more actuators can be coupled to a processor via a network (e.g., as described herein with regard to couple the one or more sensors 202 to a processor).

Further, although FIG. 4 illustrates four vents 402, it should be appreciated that the architecture of the divider 302 is not so limited. For example, the one or more dividers 302 can comprise fewer or additional vents 402 than the four shown in FIG. 4. Additionally, the one or more vents 402 can be opened and/or closed independently of each other and/or simultaneously. Through manipulation of the one or more vents 402, a user of the oven 100 can control the distribution of atmosphere amongst various regions of the baking area 116.

Figure 5:
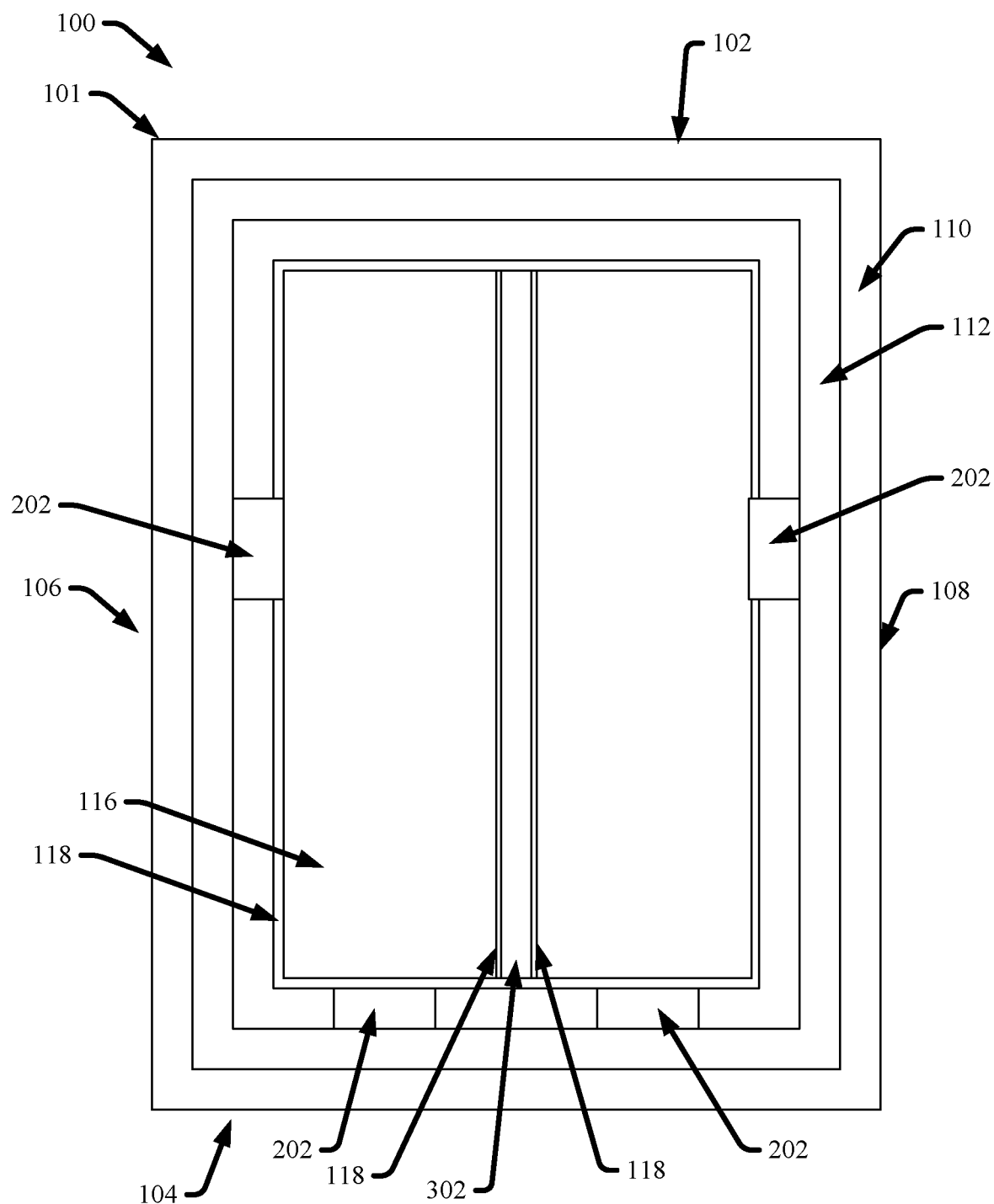
FIG. 5 illustrates a diagram of an example, non-limiting cross-section of an oven comprising a plurality of wall layers that can house one or more sensors in accordance with one or more embodiments described herein

FIG. 5 illustrates a diagram of the example, non-limiting oven 100 further comprising the coating 118 covering one or more sensors 202. Repetitive description of like elements employed in other embodiments described herein is omitted for sake of brevity. As shown in FIG. 5, one or more of the sensors 202 can be covered, entirely and/or partially, by the coating 118.

Covering one or more of the sensors 202 with the coating 118 can facilitate protection of the sensors 202 and/or thermal unity of the baking area 116. For example, one or more of the sensors 202 can be pressure sensors, which can be calibrated to accommodate for any pressure changes caused by the coating 118. Further, the coating 118 covering the pressure sensors can have a high emissivity (e.g., greater than or equal to 0.8 and less than or equal to 1); thereby allowing the coating 118 to absorb thermal energy and radiate said thermal energy over an area covering the pressure sensors 202. Thus, covering the pressure sensors with the coating 118 can facilitate a distribution of thermal energy across the entirety of the inner wall layer 114 without impeding the measurements of the subject one or more sensors 202.

Additionally, as shown in FIG. 5, the oven 100 can comprise both: sensors 202 covered with the coating 118; and sensors 202 not covered with the coating 118. Wherein covering a sensor with the coating 118 would impede the detecting capacity of the sensor 202, the coating 118 can be absent the section of the inner wall layer 114 that houses said sensor 202. For example, the coating 118 could impede a camera's (e.g., a thermal imaging camera) ability to capture images of the baking area 116, and thus, covering the camera with the coating 118 can be avoided.

Figure 6:
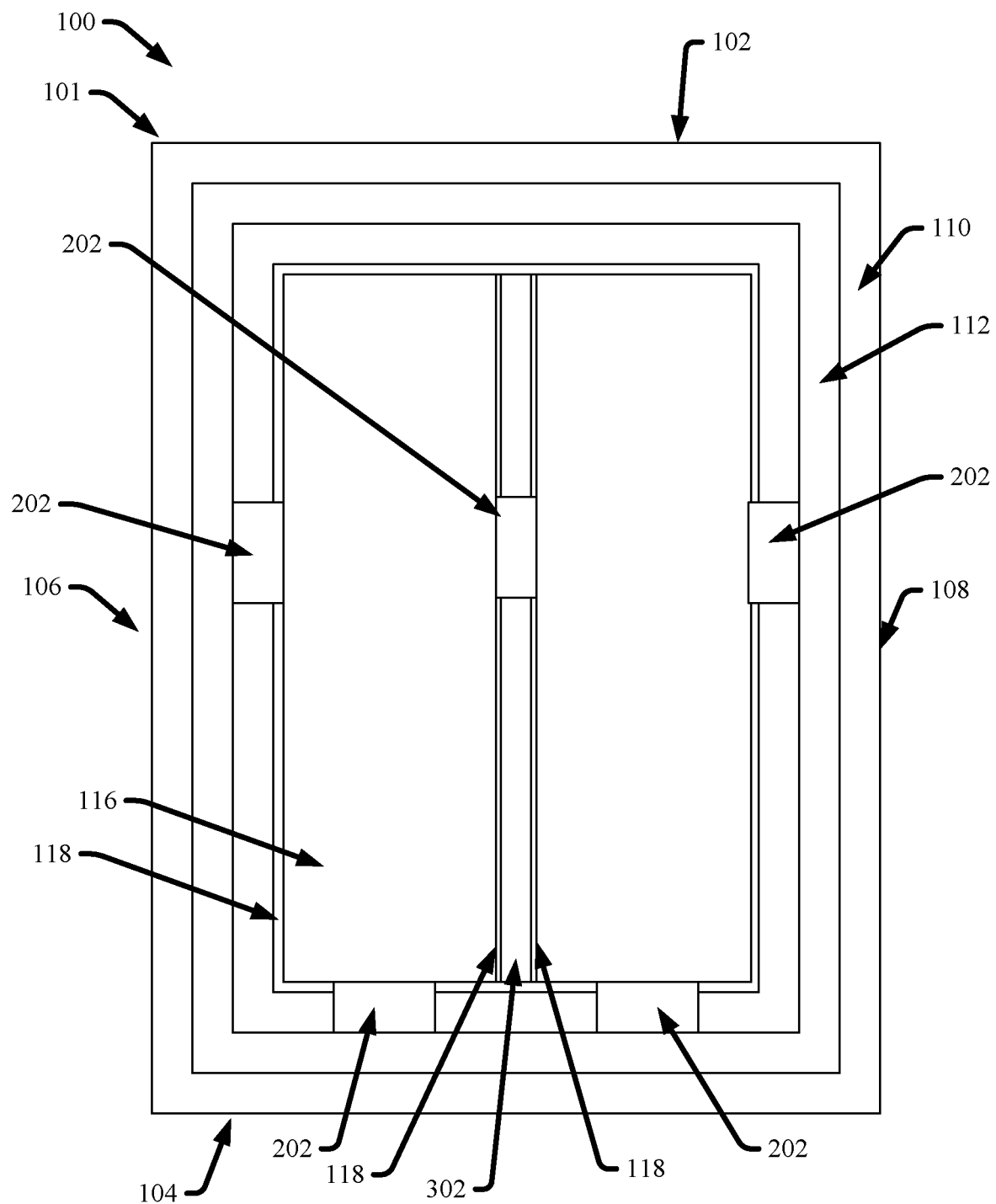
FIG. 6 illustrates a diagram of an example, non-limiting cross-section of an oven comprising one or more oven wall dividers that can house one or more sensors in accordance with one or more embodiments described herein.

FIG. 6 illustrates a diagram of the example, non-limiting oven 100 further comprising one or more dividers 302 having one or more sensors 202 in accordance with one or more embodiments described herein. Repetitive description of like elements employed in other embodiments described herein is omitted for sake of brevity.

As shown in FIG. 6, one or more of the dividers 302 can comprise one or more of the sensors 202. As described herein, one or more sensors 202 housed within the divider 302 can be coupled to a processor via one or more networks. Further, one or more sensors 202 housed within the divider 302 can be covered or not covered by one or more embodiments of the coating 118. Further, although FIG. 6 illustrates a single sensor 202 comprising a single divider 302, it should be appreciated that the architecture of the divider 302 is not so limited. A subject divider 302 can comprise a plurality of sensors 202. Also, the oven 100 can comprise a plurality of dividers 302 each comprising one or more sensors 202. Moreover, respective dividers 302 can comprise the same types of the sensors 202 and/or different types of sensors 202.

Through use of a divider 302 comprising a sensor 202, a user of the oven 100 can strategically place one or more sensors 202 at various locations within the baking area 116 in order to monitor various perspectives of the baking area's 116 environment and/or products. Additionally, the one or more dividers 302 can comprise one or more sensors 202 that the oven body 101 does not comprise; thereby enabling a user of the oven 100 to monitor baking and/or product variables that otherwise would not be obtainable by the oven's 100 standard configuration (e.g., a configuration that does not include the one or more dividers 302). Furthermore, the dividers 302 can enable a user of the oven 100 to update the oven's 100 monitoring capacity without renovating the oven 100. For example, as sensing technology advances, state-of-the-art sensors 202 can be incorporated into dividers 302 at a lower cost than would otherwise be incurred to renovate the oven body 101 to include said sensors 202.

Figure 7:
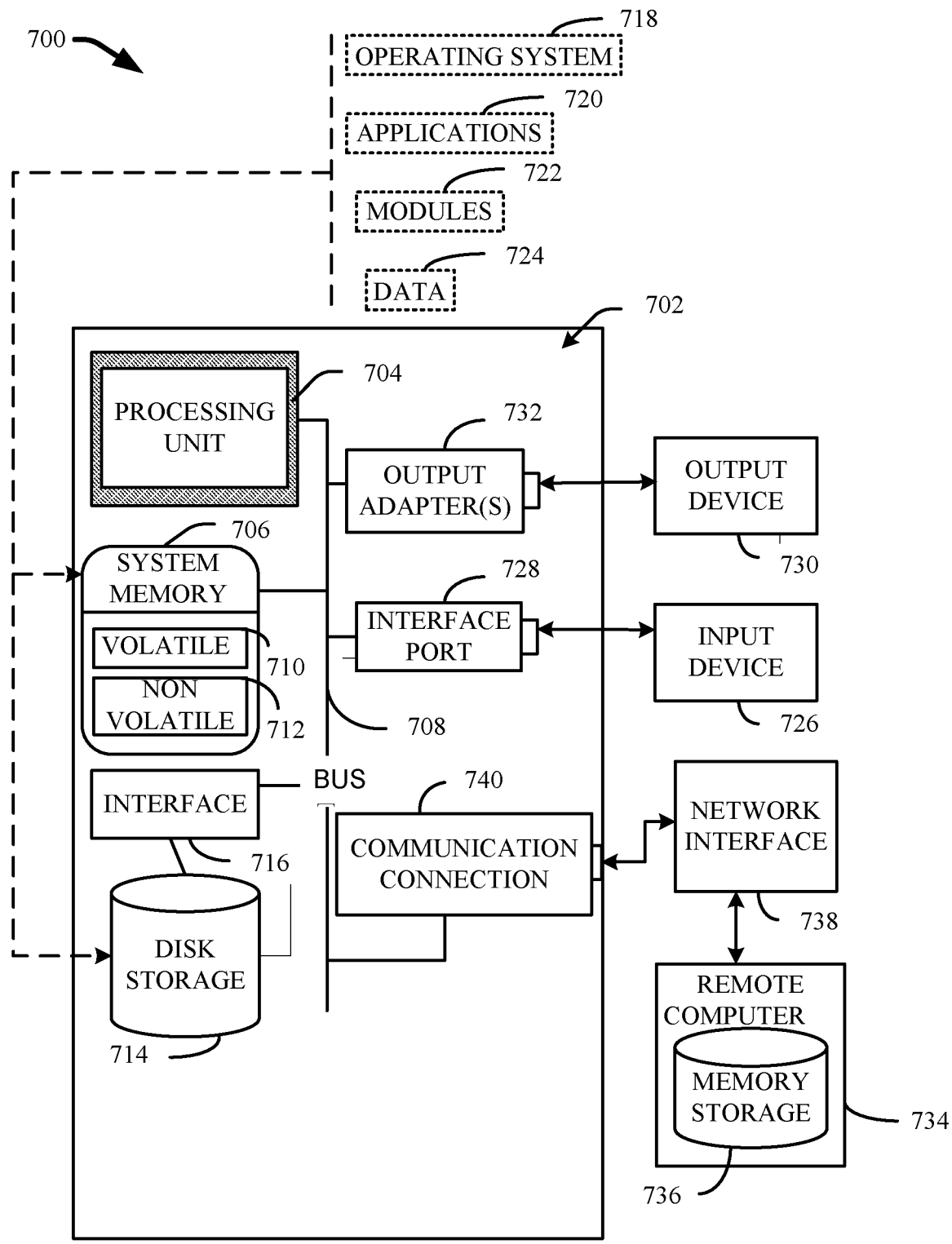
FIG. 7 illustrates a block diagram of an example, non-limiting operating environment in which one or more embodiments described herein can be facilitated.

To provide a context for the various aspects of the disclosed subject matter, FIG. 7 as well as the following discussion are intended to provide a general description of a suitable environment in which the various aspects of the disclosed subject matter can be implemented. For example, FIG. 7 can provide context for operation of the one or more sensors 202 and/or the one or more vents 402, which can be coupled to a processor and/or remotely controlled (e.g., via computerized assistance). The environment depicted in FIG. 7 can be located within the oven 100, adjacent to the oven 100, and/or separate from the oven 100. For example, the oven body 101 can house the computer 702, or the computer can be located outside the oven body 101 (e.g., adjacent to the oven body 101 or a separate location than the oven 100).

FIG. 7 illustrates a block diagram of an example, non-limiting operating environment in which one or more embodiments described herein can be facilitated. Repetitive description of like elements employed in other embodiments described herein is omitted for sake of brevity. With reference to FIG. 7, a suitable operating environment 700 for implementing various aspects of this disclosure can include a computer 702. The computer 702 can also include a processing unit 704, a system memory 706, and a system bus 708. The system bus 708 can operably couple system components including, but not limited to, the system memory 706 to the processing unit 704. The processing unit 704 can be any of various available processors. Dual microprocessors and other multiprocessor architectures also can be employed as the processing unit 704. The system bus 708 can be any of several types of bus structures including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire, and Small Computer Systems Interface (SCSI). The system memory 706 can also include volatile memory 710 and nonvolatile memory 712. The basic input/output system (BIOS), containing the basic routines to transfer information between elements within the computer 702, such as during start-up, can be stored in nonvolatile memory 712. By way of illustration, and not limitation, nonvolatile memory 712 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 710 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 702 can also include removable/non-removable, volatile/non-volatile computer storage media. FIG. 7 illustrates, for example, a disk storage 714. Disk storage 714 can also include, but is not limited to, devices like a magnetic disk drive, floppy disk drive, tape drive, Jaz drive, Zip drive, LS-100 drive, flash memory card, or memory stick. The disk storage 714 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 714 to the system bus 708, a removable or non-removable interface can be used, such as interface 716. FIG. 7 also depicts software that can act as an intermediary between users and the basic computer resources described in the suitable operating environment 700. Such software can also include, for example, an operating system 718. Operating system 718, which can be stored on disk storage 714, acts to control and allocate resources of the computer 702. System applications 720 can take advantage of the management of resources by operating system 718 through program modules 722 and program data 724, e.g., stored either in system memory 706 or on disk storage 714. It is to be appreciated that this disclosure can be implemented with various operating systems or combinations of operating systems. A user enters commands or information into the computer 702 through one or more input devices 726. Input devices 726 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices can connect to the processing unit 704 through the system bus 708 via one or more interface ports 728. The one or more Interface ports 728 can include, for example, a serial port, a parallel port, a game port, and a universal serial bus (USB). One or more output devices 730 can use some of the same type of ports as input device 726. Thus, for example, a USB port can be used to provide input to computer 702, and to output information from computer 702 to an output device 730. Output adapter 732 can be provided to illustrate that there are some output devices 730 like monitors, speakers, and printers, among other output devices 730, which require special adapters. The output adapters 732 can include, by way of illustration and not limitation, video and sound cards that provide a means of connection between the output device 730 and the system bus 708. It should be noted that other devices and/or systems of devices provide both input and output capabilities such as one or more remote computers 734.

Computer 702 can operate in a networked environment using logical connections to one or more remote computers 734, such as remote computer 734. The remote computer 734 can be a computer, a server, a router, a network PC, a workstation, a microprocessor based appliance, a peer device or other common network node and the like, and typically can also include many or all of the elements described relative to computer 702. For purposes of brevity, only a memory storage device 736 is illustrated with remote computer 734. Remote computer 734 can be logically connected to computer 702 through a network interface 738 and then physically connected via communication connection 740. Further, operation can be distributed across multiple (local and remote) systems. Network interface 738 can encompass wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). One or more communication connections 740 refers to the hardware/software employed to connect the network interface 738 to the system bus 708. While communication connection 740 is shown for illustrative clarity inside computer 702, it can also be external to computer 702. The hardware/software for connection to the network interface 738 can also include, for exemplary purposes only, internal and external technologies such as, modems including regular telephone grade modems, cable modems and DSL modems, ISDN adapters, and Ethernet cards.

Embodiments of the present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, in order to perform aspects of the present invention.

Aspects of the present invention are described herein with reference to block diagrams of methods, apparatus (systems), and computer program products according to embodiments of the invention. It will be understood that each block of the block diagrams, and combinations of blocks in the block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the block diagram block or blocks.

The block diagrams in the Figures illustrate the architecture, functionality, and operation of possible implementations of systems, methods, and computer program products according to various embodiments of the present invention. In this regard, each block in the block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams illustration, and combinations of blocks in the block diagrams illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components including a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An oven system, comprising:
   a memory that stores computer executable components;
   a processor, operably coupled to the memory, that executes the computer executable components; and
   an oven body that defines a baking area, wherein the oven body comprises a vertical dividing wall that segregates the baking area into multiple baking areas, and wherein the dividing wall includes carbon nanotubes and a sensor that is operatively coupled to the processor, and wherein a first wall layer of the dividing wall exposed to a first baking area of the multiple baking comprises a first plurality of carbon nanotubes oriented to direct thermal conductivity in a first manner in the first baking area and a second wall layer of the dividing wall exposed to a second baking area of the multiple baking areas comprises a second plurality of carbon nanotubes oriented to direct thermal conductivity in a second manner in the second baking.

2. The oven system of claim 1, wherein the oven body further comprises a second sensor, wherein the computer executable components cause the processor to configure the sensor to monitor an atmosphere of the baking area, and wherein the computer executable components cause the processor to configure the second sensor to monitor an object within the baking area.

3. The oven system of claim 2, further comprising an adjustable vent operatively coupled to the processor, wherein the computer executable components cause the processor to adjust the adjustable vent based on data from the sensor.

4. The oven system of claim 3, wherein an adjustment of the adjustable vent by the processor manipulates a distribution of the atmosphere between two or more baking areas of the multiple baking areas.

5. The oven system of claim 2, wherein the oven body further comprises a plurality of walls that include a plurality of carbon nanotubes oriented to direct thermal conductivity within the oven body.

6. The oven system of claim 3, wherein the dividing wall is removably attached to one or more of a plurality of walls.

7. An oven system, comprising:
   a memory that stores computer executable components;
   a processor, operably coupled to the memory, that executes the computer executable components;
   an oven body that defines a baking area, wherein the oven body comprises a vertical dividing wall that segregates the baking area into multiple baking areas, wherein a first wall layer of the dividing wall exposed to a first baking area of the multiple baking comprises a first plurality of carbon nanotubes oriented to direct thermal conductivity in a first manner in the first baking area and a second wall layer of the dividing wall exposed to a second baking area of the multiple baking areas comprises a second plurality of carbon nanotubes oriented to direct thermal conductivity in a second manner in the second baking; and
   a sensor operably coupled to the processor and included in the dividing wall, wherein the sensor collects data regarding an atmosphere of at least one of the multiple baking areas.

8. The oven system of claim 7, further comprising:
an adjustable vent operably coupled to the processor and included in the dividing wall, wherein operation of the adjustable vent manipulates a distribution of the atmosphere between two or more baking areas of the multiple baking areas, and wherein the adjustable vent is configured to fully close.

9. The oven system of claim 8, wherein the computer executable components cause the processor to control the operation of the adjustable vent based on the data collected by the sensor.

10. The oven system of claim 7, further comprising:
a second sensor operably coupled to the processor and included in a wall of the oven body, wherein the second sensor collects baking data regarding an object positioned in the baking area.

11. The oven system of claim 7, wherein the oven body comprises a plurality of walls that include carbon nanotubes oriented to direct thermal conductivity in the baking area.

12. The oven system of claim 11, wherein the dividing wall is removably attached to the plurality of walls.

13. The oven system of claim 7, wherein the sensor is an air quality sensor configured to measure an amount of volatile organic compounds within the at least one of the multiple baking areas.

* * * * *